United States Patent [19]

Weaver

[11] 4,396,906
[45] Aug. 2, 1983

[54] METHOD AND APPARATUS FOR DIGITAL HUFFMAN ENCODING

[75] Inventor: Charles S. Weaver, Palo Alto, Calif.

[73] Assignee: SRI International, Menlo Park, Calif.

[21] Appl. No.: 207,728

[22] Filed: Nov. 17, 1980

Related U.S. Application Data

[63] Continuation-in-part of Ser. No. 202,457, Oct. 31, 1980.

[51] Int. Cl.³ .............................................. H03K 13/24
[52] U.S. Cl. .............................. 340/347 DD; 358/260
[58] Field of Search ................ 340/347 DD; 235/210, 235/211; 358/260, 261

[56] References Cited

U.S. PATENT DOCUMENTS 3,560,639   2/1971   Centanni ............................ 358/261

OTHER PUBLICATIONS

Miessler, "IBM Technical Disclosure Bulletin", vol. 17, No. 5, Oct. 1974, pp. 1489-1491.
Atrubin, "IBM Technical Disclosure Bulletin", vol. 14, No. 3, Aug. 1971, pp. 874-876.
Bahl, "IBM Technical Disclosure Bulletin", vol. 14, No. 2, Jul. 1971, pp. 477-478.

Primary Examiner—C. D. Miller
Attorney, Agent, or Firm—Victor R. Beckman

[57] ABSTRACT

Coding and decoding method and apparatus are disclosed for implementation of a novel truncated Huffman type code using different length code words. Input signals to be encoded have different probabilities of occurance, and the most frequently occuring signals are assigned the shortest code words. Infrequently occuring input signals are labelled using one of the code words. The set of different length code words employed in the invention include a single binary 1 bit at the least significant bit position of each of the code words. Decoding simply includes means for counting the number of binary 0 bits between the 1 bits of the code word stream.

21 Claims, 6 Drawing Figures

FIG-3
| $\Delta_n$ | CODE | ROM 250 OUTPUT | APPROXIMATE PROBABILITY | WORD LENGTH |
|---|---|---|---|---|
| -3 | 00000001 | 10000000 | 0.011 | 8 |
| 3 | 0000001 | 01000000 | 0.012 | 7 |
| else(-4) | 000001 | 00100000 | 0.018 | 6 |
| -2 | 00001 | 00010000 | 0.057 | 5 |
| 2 | 0001 | 00001000 | 0.059 | 4 |
| -1 | 001 | 00000100 | 0.189 | 3 |
| 1 | 01 | 00000010 | 0.188 | 2 |
| 0 | 1 | 00000001 | 0.467 | 1 |
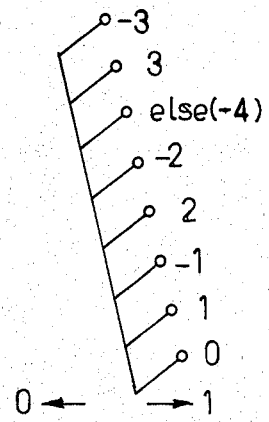
TREE
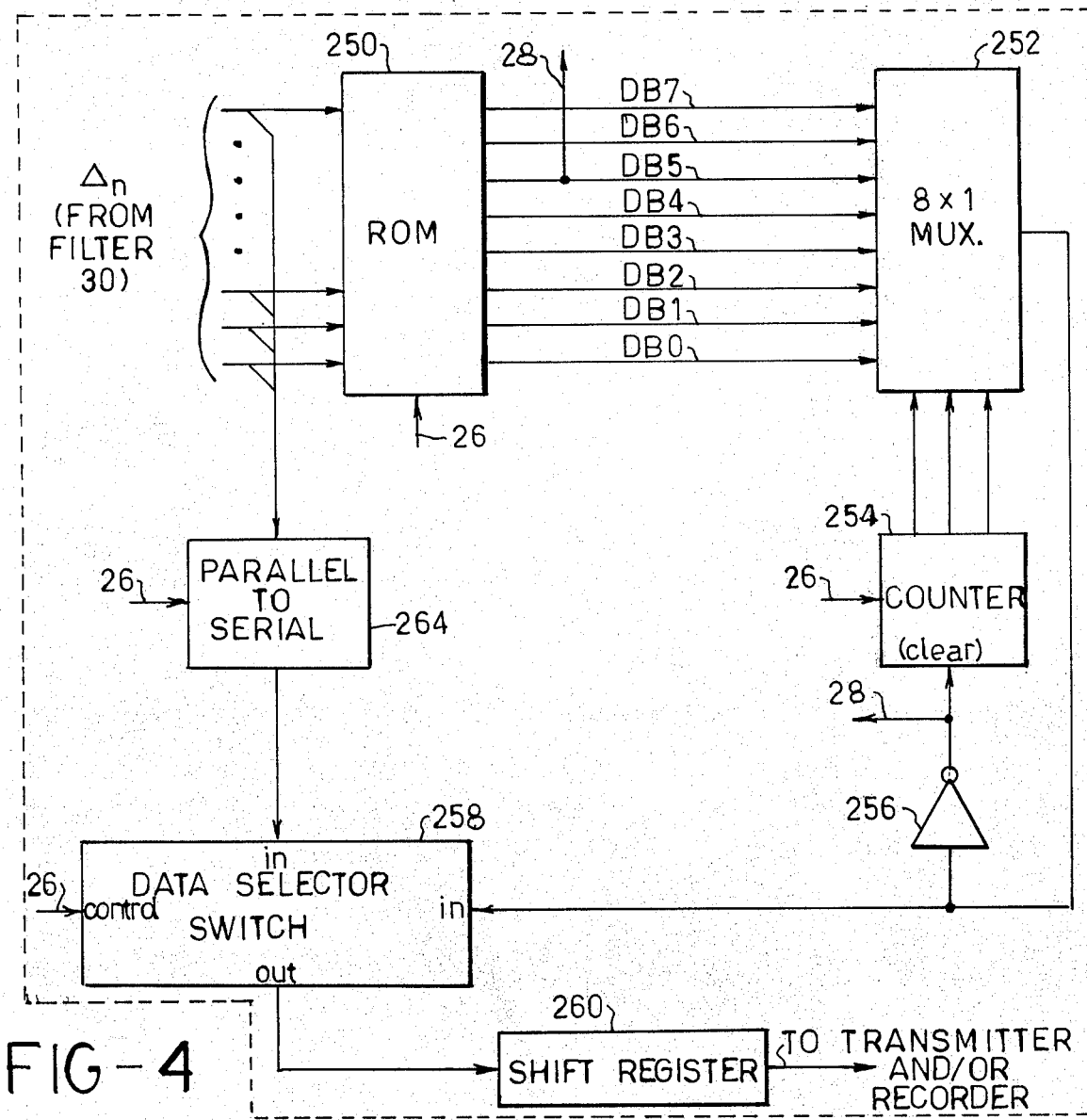
FIG-4

METHOD AND APPARATUS FOR DIGITAL HUFFMAN ENCODING

RELATED APPLICATIONS

This is a continuation-in-part application of U.S. Application Ser. No. 202,457 filed Oct. 31, 1980 by Charles S. Weaver, entitled METHOD AND APPARATUS FOR DIGITAL DATA COMPRESSION.

BACKGROUND OF THE INVENTION

Compression of fixed word length digital data by Huffman encoding is known as disclosed in an article by D. A. Huffman entitled, "A Method for the Construction of Minimum Redundancy Codes." *Proc. IRE,* 40: 1098, 1952. Truncated Huffman type encoding also is known as disclosed in an article by U. E. Ruttiman and H. V. Pipberger entitled, "Compression of the ECG by Prediction or Interpolation and Entropy Encoding," *IEE Transactions on Biomedical Engineering,* Vol. BME-26, No. 11, pp.613-623, Nov. 1979, and an article by K. L. Ripley and J. R. Cox, Jr. entitled, "A Computer System for Capturing Transient Electrocardiographic Data," *Pro. Comput. Cardiol.* pp. 439-445, 1976. A Huffman code has the property that two or more code words cannot be placed in sequence to generate another member of the code-word set. This property makes it possible to find the beginning and end of each code word when the word length is variable without an end-of-word symbol. The average number of bits per code word is no greater than one plus the entropy of the source.

With a truncated Huffman code, code words are assigned to only a small number of the most probable values of digital data to be encoded. For all other values, the actual digital data is transmitted together with a label.

SUMMARY OF THE INVENTION AND OBJECTS

The principal object of this invention is the provision of simplified truncated Huffman coding and decoding means which are readily implemented with a minimum of logic and computing capability.

Generally, the truncated Huffman coding and decoding means of this invention are used in conjunction with a compression-reconstruction filter combination in which the compression filter generates digital difference signals related to the difference between a sample signal and an estimated value thereof. The difference signals are supplied to the Huffman coder of this invention which implements a novel truncated Huffman type code which includes a single 1's bit in the code word at the least significant bit position. Any other bit positions of the code word contain only 0's. Infrequently occurring difference signals are labelled, and the labelled difference signal is provided at the output from the coder. Decoding simply includes the counting of 0's between the 1's bits, and is readily implemented at high speed with a minimum of hardware.

BRIEF DESCRIPTION OF THE DRAWINGS

The invention will be better understood from the following description when considered with the accompanying drawings. In the drawings, wherein like reference characters refer to the same parts in the several views:

FIG. 3 is a table showing a novel truncated Huffman code embodying the present invention;

FIG. 4 is a block diagram showing details of a novel truncated Huffman encoder embodying the present invention.

Figure 1A:
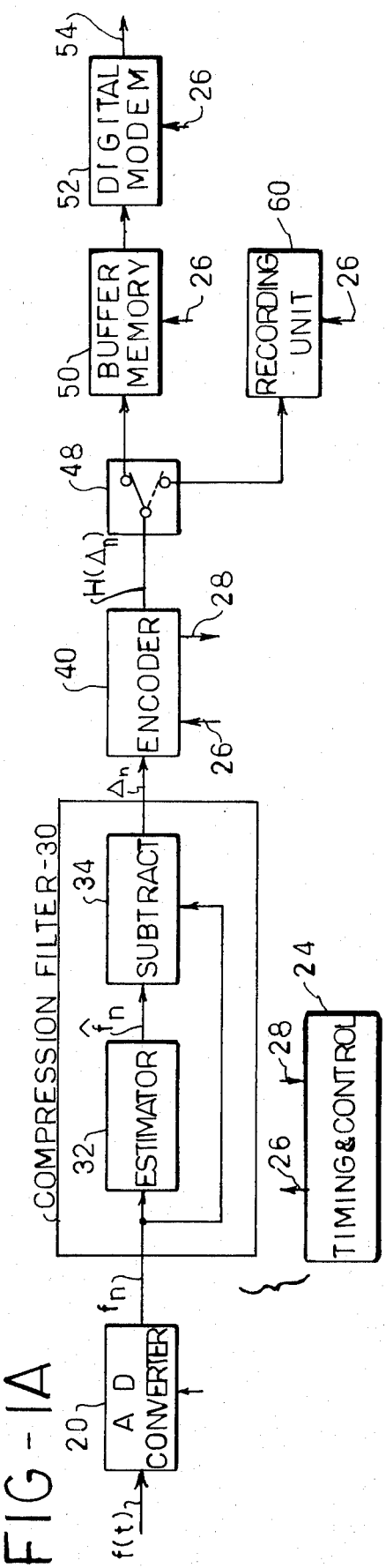
FIGS. 1A and 1B together show a block diagram of a digital system of a type which may employ the novel truncated Huffman code of the present invention; there being shown a digital transmitter unit in FIG. 1A and a receiver unit in FIG. 1B.

Reference first is made to FIG. 1A wherein the transmitting unit of the system is shown comprising an analog to digital converter (A/D converter) 20 for conversion of an analog input signal f(t) into digital form, the $n^{th}$ sample from the analog to digital converter 20 being identified as $f_n$. At A of FIG. 2, an analog signal 22 is shown which comprises an input to the analog to digital converter 20. The form of the analog to digital converter output is shown at B of FIG. 2. There the A/D converter output is shown comprising samples $f_{n-1}$ through $f_{n+i}$ of equal length words. The analog to digital converter 20 operates at a sampling rate established by control signals from a timing and control unit 24 supplied thereto over transmitter timing line 26. As employed herein, line 26 from the timing and control unit 24 represents a plurality of timing circuit outputs, one or more of which are supplied to the system elements for proper system timing and control. Inputs also are supplied to the timing and control unit over line 28 for control thereof by signals from various other system elements in a manner described in detail hereinbelow. For present purposes, it will be understood that the A/D converter 20 operates in a conventional manner at a fixed sampling rate and with a fixed word length output.

The digital output from the A/D converter 20 is supplied to a digital compression filter 30 which, for purposes of description only, is shown to include an estimator 32 and subtracting means 34. The estimator 32 provides an estimate of $f_n$, here identified as $\hat{f}_n$, based upon actual samples occuring both before and after the sample $f_n$ to be estimated. Estimators for providing such estimated $\hat{f}_n$ values are, of course, well known. A difference signal $\Delta_n$ is produced by the compression filter 30 comprising the difference between the actual signal input $f_n$ and the estimated signal values $\hat{f}_n$ by subtraction of the estimated value from the actual value at subtracting means 34, as follows:

$$\Delta_n = f_n - \hat{f}_n \tag{1}$$

Figure 2:
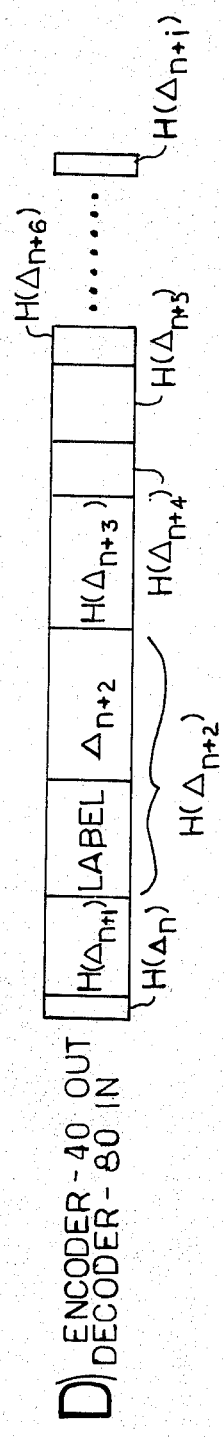
FIG. 2 shows a waveform and graphic representations of signals appearing at various locations in the system shown in FIGS. 1A and 1B.

In the graphic signal representation of the compression filter output, shown at C in FIG. 2, difference signals $\Delta_n$, $\Delta_{n+1}$, $\Delta_{n+2}$, $\Delta_{n+3}$, $\Delta_{n+4}$ ... $\Delta_{n+i}$ are shown, with actual difference signal values being shown in parenthesis beneath the symbols for purposes of illustration only.

The difference signal values $\Delta_n$ are supplied to an encoder 40 employing a novel truncated Huffman code for encoding the same. In general, the Huffman encoding technique makes use of the fact that the compression filter 30 has difference signal outputs, $\Delta_n$, having different probabilities of occurance, and uses this fact to achieve a reduction in the total number of bits in the encoded signal over the input signal. A single code word is assigned to infrequently occuring difference signals, and supplied as a label for the actual difference signal value $\Delta_n$. In FIG. 1A, the encoder 40 output is designated $H(\Delta_n)$ and, at D in FIG. 2, the values $H(\Delta_n)$, $H(\Delta_{n+1})$ etc. represent encoded values of $\Delta_n$, $\Delta_{n+1}$, etc. The most frequently occuring value of $\Delta_n$ (here zero) is encoded using the shortest code word. The novel truncated Huffman code together with novel encoder and decoder means for implementing the same are described in detail below. For present purposes, it will be understood that the encoder 40 output comprises code words for the most frequently occuring values of $\Delta_n$, together with a combined code word label and actual value of the difference signal $\Delta_n$ for less frequently occuring values of $\Delta_n$. For purposes of illustration, if the difference signal value exceeds $\pm 3$ then the actual difference signal $\Delta_n$ together with a code word label is produced at the encoder output. At D of FIG. 2, wherein the encoded difference values are shown, it will be seen that the encoded value for $\Delta_{n+2}$ comprises a label and the actual difference signal $\Delta_{n+2}$ for the infrequently occuring difference value of $\Delta_{n+2}$, here six (6).

The encoded signals from encoder 40 are transmitted to a remote receiver and/or are recorded. For transmission to a remote receiver, the encoder output is connected through a switch 48 to a buffer memory 50 and thence to a digital modem 52 for transmission over transmission line 54. With the switch 48 in the other, broken line, position, the encoder output is supplied to a recording unit 60 for recording of the encoded difference signals and labeled $\Delta_n$ signals.

Figure 1B:
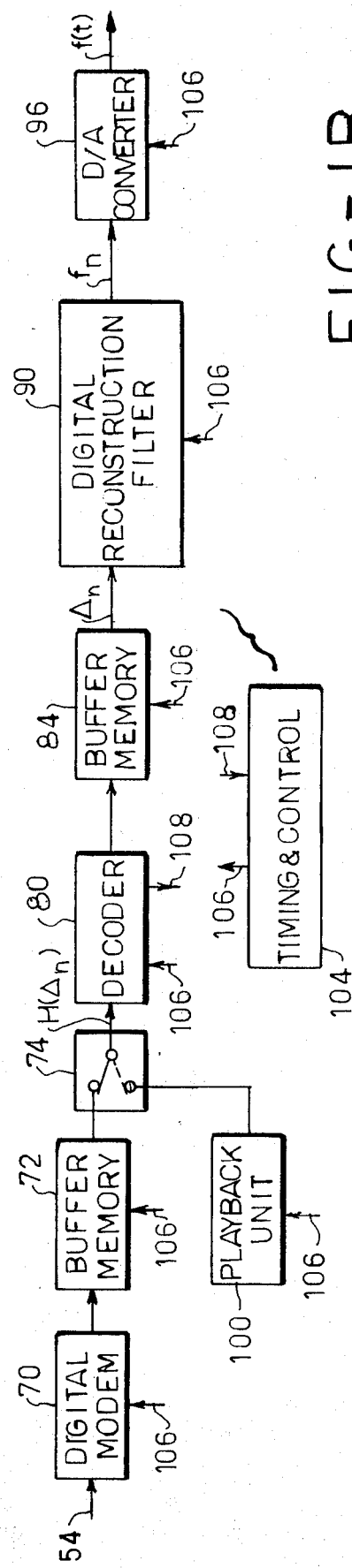

When telephone transmission is employed, for example, the encoded signals are transmitted over line 54 to a digital modem 70 at the receiver shown in FIG. 1B. The modem output is buffered by buffer memory 72, and the buffer memory output is supplied through a switch 74 to a decoder 80 for decoding the truncated Huffman encoded signals. At the decoder 80, the Huffman code words are converted to the original difference signals $\Delta_n$. Where the Huffman code word comprises a labeled actual difference signal, the label is stripped therefrom, and the actual difference signal without the label is supplied to the decoder output. Novel encoding and decoding means, embodying the present invention are described in detail hereinbelow.

The difference signals $\Delta_n$ from the decoder 80 are supplied to a reconstruction, or decompression, filter 90, through a small, one word, buffer memory 84. The decoder output signals are produced at varying rates, and the small buffer memory 84 is included to accommodate the input rate requirements of the reconstruction filter 90. From the difference signal values, actual signal values $f_n$ for every sample are determined at the reconstruction filter 90. Compression filter 30 and reconstruction filter 90, combinations are well known. A digital to analog converter (D/A converter) 96 converts the actual signal samples $f_n$ from the digital reconstruction filter 90 to analog form, and any desired use may be made of the analog signals. A receiver timing and control unit 104 supplies timing signals to the various receiver elements over line 106 for proper timing of the receiving operation. Also, control signals for the unit 104 are supplied thereto over line 108 from various elements of the receiver for control thereof in a manner described in greater detail hereinbelow.

Recorded encoded digital signals, such as those recorded at recording unit 60, FIG. 1A, may be supplied to the decoder 80 for decoding and subsequent processing. With switch 74 in the broken line position, signals are supplied to the decoder 80 from a playback unit 100.

As noted above in the description of FIG. 1A, the digital compression filter 30 includes an estimator 32 having an output comprising an estimated sample value $\hat{f}_n$ based upon actual samples $f_{n-1}$ and $f_{n+1}$ occuring before and after the sample $f_n$ to be estimated. Often prior art estimators are used which provide an output.

$$\hat{f}_n = a_1 f_{n+1} + a_2 f_{n-1} \tag{2}$$

where the coefficients $a_1$ and $a_2$ are chosen to minimize the mean square error of the difference $\Delta_n$, where $\Delta_n = f_n - \hat{f}_n$, as noted in equation (1), above. For compression of ECG signals, for example, the coefficients $a_1$ and $a_2$ are substantially optimum when they equal 0.5. Consequently, for $a_1 = a_2 = 0.5$, equations (1) and (2) may be combined to give $$\begin{aligned}\Delta_n &= 0.5 \, [f_{n+1} - 2f_n + f_{n-1}] \\ &= 0.5 f_{n+1} - f_n + 0.5 f_{n-1}\end{aligned} \tag{3}$$

It will be seen that the quantity inside the brackets is the second difference of $f_n$ and, since the sample rate is greater than the Nyquist rate, the second difference is equivalent to the second derivative. Digital data compression systems which employ such a double difference compression filter include a reconstruction filter of the double integration type in the receiver unit for decoding such double difference signals. Thus, where a prior art double difference type compression filter 30 is employed in the system, an associated double integration type reconstruction filter 90 would be employed therewith. In such a case, the reconstruction filter 90 would operate to make use of the following equations:

$$\hat{f}_{n+1} = \frac{f_n}{a_1} - \frac{a_2}{a_1} f_{n-1} \tag{4}$$

$$= \frac{f_n - \Delta_n}{a_1} - \frac{a_2}{a_1} f_{n-1} \tag{5}$$

From equation (5), which is recursive, it will be apparent that two adjacent sample values together with the value of $\Delta_n$ are required for the solution thereof. Thereafter, only the values of $\Delta_n$ are required, once two initial values of $f_n$ are supplied. Similar algorithms can be derived for any number of coefficients.

A novel truncated Huffman code which may be used in the illustrated system is shown in the table of FIG. 3. The difference signals, $\Delta_n$, which occur most frequently are assigned a code word. Where the input to the system comprises a digitized ECG signal, and a digital compression filter of the above-described type is employed, the probability of $\Delta_n$ comprising a value of between $+3$ and $-3$ is, approximately, 0.98. These difference signals are assigned different length code words, with the most frequently occuring difference signal being assigned the shortest code word. All other difference signals outside the range of $\pm 3$ are identified as else in the table, and these are assigned a code word which, as described above with reference to FIG. 2, comprises a label for the actual difference value $\Delta_n$ which subsequently is recorded and/or transmitted. With the present system, the transmission of the actual $\Delta_n$ value contributes approximately 0.16 bits to the average per symbol (about 10%). However, this is not 10% added to the untruncated Huffman code bit rate, because the code words in the latter code that are assigned to the $\Delta_n$'s that make up else in the truncated code will be no longer than the word that indicates that else has occured in the truncated code.

In FIG. 3, the approximate probability of occurance of the difference signals $\Delta_n$ is shown to range from 0.467 maximum to 0.011 minimum. The unique code word set comprises a 1's bit in the least significant bit position. Any other bit position comprises a zero bit. As will become apparent, simple coding and decoding hardware may be used in implementing this code. The decoder can be represented by the tree included in FIG. 3, where the left branches represent 0's and right branches 1's. The final branches, which are all 1's in this case, indicate the decoded word. The starting bit is entered at the bottom of the tree and the branches are followed until a final branch is reached, then the tree is reentered at the bottom.

The novel encoder 40, to which the difference signal $\Delta_n$ is supplied from the digital compression filter 30 is shown in FIG. 4. There, the encoder is shown comprising a read only memory (ROM) 250 to which the difference signal, $\Delta_n$, from the digital compression filter 30 of FIG. 1 is supplied as an address input.

The ROM stores the following 8 bit words:
00000001
00000010
00000100
00001000
00010000
00100000
01000000
10000000

These outputs also are included in the table shown in FIG. 3 adjacent the difference signal $\Delta_n$ input which produces the same. For example, an input of 2 addresses the location where 00001000 is stored. Any $\Delta_n$ input in the else catagory, here, outside the range of ±3 will address a location where 00100000 is stored.

The ROM outputs are supplied as inputs to an 8:1 multiplexer 252 which is addressed by the output from a counter 254. The counter is driven by clock pulses from timing and control unit 24 (FIG. 1A) and is cleared by application of the signal supplied thereto from the multiplexer output through an inverter 256. In the above example, wherein a $\Delta_n$ signal of 2 provides an output of 00001000 from the ROM, data line DB3 is high and the others are low. Bits are serially switched from the ROM 250 by operation of the multiplexer 252, until the first 1 output is reached, at data line DB3 in this example, at which time a clear signal is supplied to the counter 254 through inverter 256 to clear the same. Another output from the inverter 256 to the timing and control unit 24 stops the clock input to the counter until the next $\Delta_n$ signal to the encoder. The multiplexer output also is connected through a switch 258 to a shift register 260 whereby the ROM 250 output is serially switched into the shift register 260 until the first 1 appears. In the present example, the shift register 260 is loaded with the code word 0001, using the shift-left serial input of the register. Essentially, this multiplexer operation serves to strip the ROM output of bits at higher bit positions than the first 1. Code words entered into the register 260 are shifted out therefrom for transmission and/or recording.

As noted above, any difference signal $\Delta_n$ in the else catagory, here outside the range of ±3, addresses a location where 00100000 is stored, wherein data line DB5 is high and the others are low. Line DB5 is connected to the timing and control unit 24 (FIG. 1A) through line 28. With this input to the control unit 24, the switch 258 is operated for connection of the input of the shift register 260 to the data compression filter 30 output through a parallel to serial conversion register 264. Now, the actual difference signal $\Delta_n$ is entered into the register 260, again using the shift left serial input of the register. As mentioned above, the code word for else serves as a label for the actual difference signal $\Delta_n$ to identify the same for decoding.

Figure 5:
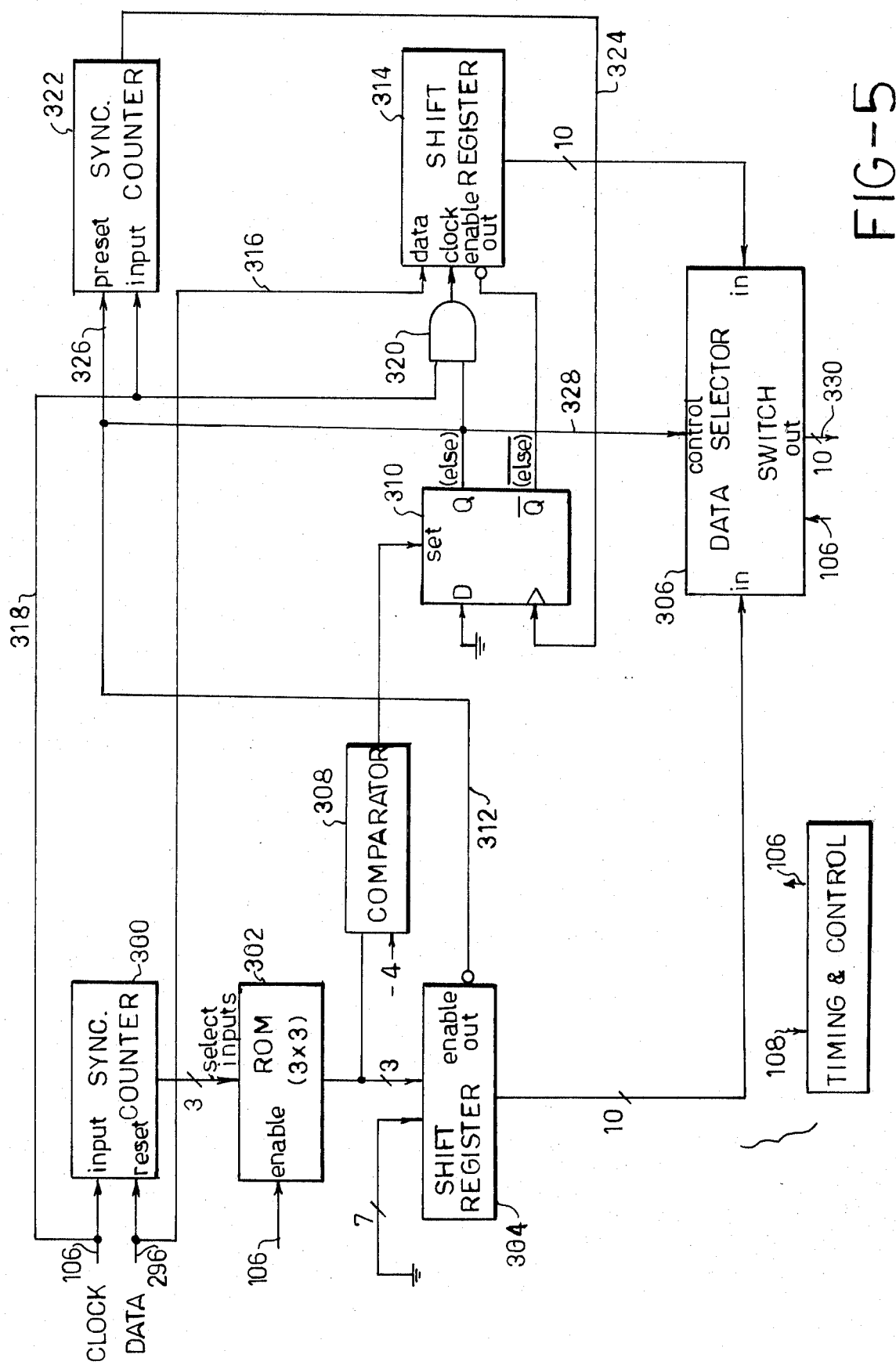
FIG. 5 is a block diagram showing details of a novel decoder for decoding the Huffman-encoded signals.

After transmission or playback the coded difference signals, $H(\Delta_n)$, are converted to actual difference signal values $\Delta_n$ by the novel decoder 80, shown in detail in FIG. 5. There, the data stream at line 296 (depicted at D of FIG. 2) is supplied as a reset signal to a synchronous counter 300. Clock pulses at line 106 from timing and control unit 104 (FIG. 1B) are supplied to the counter input to clock the same; the data stream and clock operating at the same rate. Counting proceeds so long as the data input is LOW. When the input data line 296 goes HIGH, the counter 300 is reset.

The output from the counter 300 is supplied to a read only memory (ROM) 302, to address the same. The ROM 302 serves as a code converter for decoding the Huffman encoded difference signals, $H(\Delta_n)$ here represented by the number of zeros counted by the counter 300 prior to being reset by a one in the data stream. With the illustrated code shown in FIG. 3, the ROM 302 generates the difference signal values $-3, -2, -1, 0, 1, 2$ and $3$, dependent upon the number of zeros between ones counted by the counter 300. The number $-4$ is generated when the "else" symbol is present in the data stream, i.e. when five (5) zeros between ones are counted. It will be apparent that three bits are required to represent the eight different counts from the counter 300 and the eight decoded values from the ROM 302.

The ROM 302 is enabled immediately prior to resetting of the counter 300 by application of an enable signal supplied thereto from the timing and control unit 104 (FIG. 1B) over line 106. When enabled, the three bit output is supplied to the three least significant bit inputs of a shift register 304. Arithmetic performed in the digital reconstruction filter 90 (shown in FIG. 1A) is done in 10 bits to prevent round-off error. Therefore, seven leading zeros are added to the three bit ROM 302 output to form the 10 bit input for the digital reconstruction filter. The shift register 304 supplies the necessary zeros by connecting the 7 most significant bit inputs to a source of zeros, here ground. The 10 bit register output is supplied to one input of a data selector switch 306. Unless the number $-4$ is generated by the ROM 302, the output from the register 304 is connected through the data switch 306 to the buffer amplifier 84 (FIG. 1B) and thence to the digital reconstruction filter 90.

It will be seen that the ROM output also is supplied to a digital comparator 308. The decoded label "else", here, $-4$, is supplied as a second input to the comparator. When the ROM output is $-4$, the comparator output goes HIGH and sets a flip-flop 310 whereupon the Q (else) output from the flip-flop goes HIGH. The HIGH signal from the flip-flop is connected to the enable terminal of the register 304 over line 312 to disable the output from the register. As a result, the decoded label does not appear at the output from the register 304. Instead, the actual value of $\Delta_n$ at data input line 296 is shifted into a shift register 314 over line 316.

Clock pulses for the shift register 314 are supplied thereto over line 318 from clock input line 106 through an AND gate 320, which gate is enabled by the HIGH Q output from flip-flop 310. The number of bits shifted into register 314 is determined, of course, by the number of clock pulses supplied thereto through the AND gate. The flip-flop is reset to disable the gate 320 when the actual difference signal, $\Delta_n$, has been shifted into the register 314. In the illustrated arrangement the flip-flop is reset by application of a signal to the clock input thereof from a synchronous counter 322 over line 324. The counter 322 is of the programmable type, and is set to the value 7 upon receipt of a HIGH from the Q output of flip-flop 310 at the preset input thereof over line 326. Clock pulses at the counter input now cause the counter to count down from 7 to zero. When the counter output goes to zero, the flip-flop 310 is reset upon application of a LOW to the D input thereof at the time of the clock pulse input. In this manner, 8 data bits are shifted into the register 314. Means, not shown, are included for supplying two leading zeros to the 8 bit difference signal at the register 314 to form a 10 bit length word for the digital reconstruction filter 90. The register 314 is a tri-state device, the output from which is enabled by application of a LOW to the Enable Out terminal thereof from the flip-flop 310. The HIGH from the Q output of the flip-flop is supplied to the data selector switch 306 over line 328 to control the switch for passage of the shift register 314 output to the outlet lines 330 of the switch.

As seen in FIG. 1B and described above, the output from the decoder 80 is supplied to the digital reconstruction filter 90 through the buffer memory 84. From the difference signals $\Delta_n$, the digital reconstruction filter 90 generates the actual digital signal values $f_n$. The digital signals $f_n$ may be used directly, or they first may be converted to analog form by digital to analog converter 96.

The invention having been described in detail in accordance with requirements of the Patent Statutes, various changes and modifications will suggest themselves to those skilled in this art. For example, the code may include a different number of code words for coding more or a fewer number of digital difference signals. With the illustrated code which employs a single 1's bit in the code word, it will be apparent that code words of increased length are required if the number of values to be encoded is increased. It is intended that the above and other such changes and modifications shall fall within the spirit and scope of the invention defined in the appended claims.

I claim:

1. An encoder for coding digital input signals for use in a digital recorder, transmitting, or like system comprising,
    a source of digital input signals of equal word length to be encoded, and
    means responsive to equal word length digital input signals from said source for coding those input signals which are within a predetermined signal range, said coding means comprising means for implementing a code comprising a plurality of different length code words, every which code word is of a length which is different from every other code word and each of which code words includes a single 1 bit at one end bit position of the code words, said single one bit being located at the same end of each of said code words.

2. An encoder as defined in claim 1 wherein the single 1 bit of the code words is located at the least significant bit position thereof.

3. An encoder as defined in claim 1 wherein said coding means comprises,
    a memory addressable by said input signals and having a plurality of output lines,
    shift register means,
    means operable from a starting position for sequentially connecting said output lines from said memory to said shift register, and
    means responsive to a 1 bit output from said sequential connecting means for returning said connecting means to said starting position.

4. An encoder as defined in claim 3 wherein said sequential connecting means comprises a digital multiplexer having input channels connected to the output lines from said memory, and an output channel connected to said shift register means.

5. An encoder as defined in claim 4 wherein said returning means includes a counter having an output connected to address inputs of said digital multiplexer for control thereof, which counter includes a reset input for resetting the counter, means connecting the multiplexer output channel to said reset input for resetting the counter whenever a 1 bit is present at said multiplexer output channel.

6. An encoder as defined in claim 1 wherein said source of digital input signals includes digital compression filter means to which digital sample signals are supplied, the output from said digital compression filter means being supplied to said coding means.

7. An encoder as defined in claim 6 wherein said source of digital input signals also includes analog to digital converter means to which analog signals are supplied and from which digital sample signals are obtained.

8. An encoder as defined in claim 7 wherein analog ECG signals are supplied to said analog to digital converter means.

9. In a method of encoding equal word length digital signals which includes converting those equal word length digital signals which are within a predetermined signal range to code words of different length and labeling those equal word length digital signals which are outside said predetermined signal range with a single code word which is of a length which is different than each of said different length code words, the improvement comprising,
    implementing the converting and labeling step by use of a code wherein each of the different length code words includes a single 1 bit at one end bit position thereof.

10. In a method of encoding digital signals as defined in claim 9 wherein the single 1 bit of the code words is located at the least significant bit position thereof.

11. In an encoder for coding digital input signals for use in a digital recording, transmitting, or like system, comprising,
    a source of digital input signals to be encoded, and
    means responsive to digital input signals for coding those input signals which are within a predetermined signal range and for labeling those input signals which are outside of said predetermined signal range, the improvement wherein said coding and labeling means comprises means for implementing a code comprising a plurality of different length code words, every which code word is of a length which is different from every other code word, one of which code words comprises a label for said signals outside of said predetermined signal range, each said different length code word having a single 1 bit which 1 bit is included at one end bit position of said code word, said 1 bit being located at the same end of each of said code words.

12. In an encoder as defined in claim 11 wherein the single 1 bit of the code words is located at the least significant bit position thereof.

13. A digital signal encoding-decoding combination for use in digital recording-reproducing systems, digital transmitter-receiver systems, or the like, comprising, a source of digital signals to be encoded, means responsive to digital input signals from said source for coding those input signals which are within a predetermined signal range, said coding means comprising means for implementing a code comprising a plurality of different length code words each of which code words includes a single 1 bit at one end bit position of the code word, and means responsive to code words produced by said coding means for decoding the same, said decoding means comprising means for counting the number of zero bits between 1 bits of the code words.

14. A digital signal encoding-decoding combination as defined in claim 13 wherein said single 1 bit of the code words is located at the least significant but position thereof.

15. A digital signal encoding-decoding combination as defined in claim 13 wherein said decoding means comprises means for converting the output from said counting means to digital signals corresponding to those producing said code words.

16. A digital signal encoding-decoding combination as defined in claim 15 wherein said converting means includes a memory addressable by the output from said counter, said memory including a plurality of output lines from which said digital signals corresponding to those producing the code words are read out.

17. A digital signal encoding-decoding combination as defined in claim 13 wherein said source of digital signals to be encoded includes, a source of analog signals, analog to digital converter means for converting the analog signals to digital form, a compression filter responsive to the output from the analog to digital converter means, the compression filter output being supplied to said coding means for coding thereof.

18. A digital signal encoding-decoding combination as defined in claim 17 wherein ECG signals comprise said analog signal source.

19. An encoder for converting fixed length digital words into variable length code words comprising, a memory unit addressed by said fixed length digital words to be encoded, said memory unit having stored therein a plurality of fixed length words having different numbers of 0's in adjacent bit positions of the words, a multiplexer connected to said memory unit for sequentially scanning outputs therefrom for generating said code words, said multiplexing scanning starting at an initial multiplexer address, means under control of the output from the multiplexer output for stopping multiplexer scanning when the output from the multiplexer is a 1's bit, and for returning to the initial multiplexer address in preparation for the next scanning operation.

20. An encoder as defined in claim 19 including, a shift register into which said multiplexer output is shifted for holding variable length code words from the multiplexer.

21. A digital decoder for decoding a stream of encoded digital data words which have been encoded using a code comprising a plurality of different length code words each of which includes a single 1 bit at one end position of the code word and every which code word is of a length which is different from every other code word, said decoder comprising, means responsive to a stream of encoded digital data words for counting the number of zero bits between 1 bits, and means responsive to the contents of said counting means for regenerating the digital data words.

* * * * *